United States Patent
Jun et al.

(10) Patent No.: US 12,150,255 B2
(45) Date of Patent: Nov. 19, 2024

(54) ELECTRONIC DEVICE INCLUDING CONNECTOR

(71) Applicant: SAMSUNG ELECTRONICS CO., LTD., Suwon-si (KR)

(72) Inventors: Sungsoo Jun, Suwon-si (KR); Bumsun Park, Suwon-si (KR); Beomju Kim, Suwon-si (KR); Changho Park, Suwon-si (KR); Youngkyu Kim, Suwon-si (KR); Jongchun Wee, Suwon-si (KR); Hwanseok Choi, Suwon-si (KR); Minwoo Yoo, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 381 days.

(21) Appl. No.: 17/573,773

(22) Filed: Jan. 12, 2022

(65) Prior Publication Data

US 2022/0225513 A1 Jul. 14, 2022

Related U.S. Application Data

(63) Continuation of application No. PCT/KR2021/019754, filed on Dec. 23, 2021.

(30) Foreign Application Priority Data

Jan. 13, 2021 (KR) .......................... 10-2021-0004548

(51) Int. Cl.
*H05K 5/00* (2006.01)
*G06F 1/16* (2006.01)
(Continued)

(52) U.S. Cl.
CPC ......... *H05K 5/0017* (2013.01); *G06F 1/1626* (2013.01); *G06F 1/1656* (2013.01);
(Continued)

(58) Field of Classification Search
CPC .... H05K 5/0017; H05K 5/0217; H05K 1/147; H05K 1/189; G06F 1/1626; G06F 1/1656; G06F 1/1688; H01R 12/7076
(Continued)

(56) References Cited

U.S. PATENT DOCUMENTS

2011/0003622 A1* 1/2011 Hwang .................. H05K 3/361
455/575.1
2017/0082794 A1 3/2017 Jeon et al.
(Continued)

FOREIGN PATENT DOCUMENTS

CN 109831551 A 5/2019
EP 1001304 A2 * 5/2000 ......... G02F 1/13452
(Continued)

OTHER PUBLICATIONS

Extended European Search Report issued Mar. 1, 2024 of EP Application No. 21919932.0.
(Continued)

*Primary Examiner* — Andargie M Aychillhum
(74) *Attorney, Agent, or Firm* — CANTOR COLBURN LLP

(57) ABSTRACT

An electronic device includes a housing including a front plate, a rear plate, a first support member, at least a portion of which is disposed between the front plate and the rear plate, and a second support member which faces the first support member, a display including a first display surface visually exposed to an exterior of the electronic device, and a second display surface which is opposite to the first display surface, a first connector mounted on the second display surface, a main printed circuit board disposed in the housing, and a first flexible printed circuit board connected to the main printed circuit board, where the first flexible printed
(Continued)

circuit board includes a second connector facing the second support member and connected to the first connector.

20 Claims, 11 Drawing Sheets

(51) Int. Cl.
  *H05K 5/02* (2006.01)
  *H01R 12/70* (2011.01)
  *H04M 1/02* (2006.01)
  *H05K 1/14* (2006.01)
  *H05K 1/18* (2006.01)

(52) U.S. Cl.
  CPC ......... *G06F 1/1688* (2013.01); *H05K 5/0217* (2013.01); *H01R 12/7076* (2013.01); *H04M 1/0277* (2013.01); *H05K 1/147* (2013.01); *H05K 1/189* (2013.01); *H05K 2201/10189* (2013.01)

(58) Field of Classification Search
  USPC ........................................................ 361/749
  See application file for complete search history.

(56) References Cited

U.S. PATENT DOCUMENTS

| | | | |
|---|---|---|---|
| 2018/0077793 A1 | 3/2018 | Qian | |
| 2018/0131087 A1 | 5/2018 | Kim et al. | |
| 2019/0163003 A1* | 5/2019 | Kim | G02F 1/133305 |
| 2019/0342645 A1* | 11/2019 | Jung | H04M 1/18 |
| 2019/0386380 A1 | 12/2019 | Ham et al. | |
| 2020/0028949 A1 | 1/2020 | Kim et al. | |
| 2020/0093012 A1 | 3/2020 | Woo et al. | |
| 2020/0127376 A1 | 4/2020 | Kang | |
| 2020/0127404 A1 | 4/2020 | Seo et al. | |
| 2020/0186180 A1 | 6/2020 | Park et al. | |
| 2020/0225295 A1 | 7/2020 | Hyun et al. | |
| 2020/0411989 A1 | 12/2020 | Oh | |
| 2021/0391636 A1 | 12/2021 | Kang et al. | |

FOREIGN PATENT DOCUMENTS

| | | | |
|---|---|---|---|
| JP | 2008300513 A | 12/2008 | |
| JP | 2018-170296 A | 11/2018 | |
| KR | 1020130076481 A | 7/2013 | |
| KR | 1020190020971 A | 3/2019 | |
| KR | 1020190141474 A | 12/2019 | |
| KR | 1020200009251 A | 1/2020 | |
| KR | 1020200030768 A | 3/2020 | |
| KR | 1020200045661 A | 5/2020 | |
| KR | 1020200045908 A | 5/2020 | |
| KR | 1020200069167 A | 6/2020 | |
| KR | 1020200099912 A | 8/2020 | |
| KR | 1020200113410 A | 10/2020 | |
| KR | 1020210000999 A | 1/2021 | |
| WO | WO-2019080210 A1 * | 5/2019 | ......... G02F 1/13452 |
| WO | 2020251068 A1 | 12/2020 | |

OTHER PUBLICATIONS

PCT Search Report for PCT/KR2021/019754 dated Apr. 5, 2022.
PCT Written Opinion for PCT/KR2021/019754 dated Apr. 5, 2022.

* cited by examiner

ELECTRONIC DEVICE INCLUDING CONNECTOR

CROSS REFERENCE TO RELATED APPLICATIONS

This application is a PCT-Bypass Continuation of International Patent Application No. PCT/KR2021/019754, filed on Dec. 23, 2021, which claims priority to Korean Patent Application No. 10-2021-0004548, filed on Jan. 13, 2021, and all the benefits accruing therefrom under 35 U.S.C. § 119, the contents of which are hereby incorporated by reference for all purposes as if fully set forth herein.

BACKGROUND

Field

Various embodiments of the disclosure relate to an electronic device including a connector.

Discussion of the Background

Due to the remarkable development of information communication technology and semiconductor technology, the distribution and use of various electronic devices are rapidly increasing. In particular, electronic devices are being developed such that users are capable of communicating with each other while carrying the electronic devices.

Typically, an electronic device may mean a device that performs a specific function according to an executable program provided therein (e.g., an electronic scheduler, a portable multimedia reproducer, a mobile communication terminal, a tablet PC, an image/sound device, a desktop/laptop PC, or a vehicle navigation system), as well as a home appliance. The above-mentioned electronic devices may output, for example, information stored therein as sound or an image.

As the degree of integration of electronic devices has increased and ultra-high-speed and large-capacity wireless communication has become popular, multiple functions have come to be provided in a single electronic device, such as a mobile communication terminal. For example, various functions, such as an entertainment function (e.g., a game function), a multimedia function (e.g., a music/video reproducing function), a communication and security function for mobile banking, a schedule management function, or an e-wallet function, are integrated in a single electronic device, in addition to a communication function. Such an electronic device is being miniaturized so that a user can conveniently carry the electronic device.

An electronic device (e.g., a portable terminal) includes a display. The display may be connected to a printed circuit board on which electronic components are mounted, via a flexible printed circuit board. However, when the display and the printed circuit board are connected to each other via a single flexible printed circuit board, the single flexible printed circuit board is relatively long, which may increase the manufacturing cost of the electronic device. In addition, when the display and the printed circuit board are connected to each other via a plurality of flexible printed circuit boards, connectors may be damaged or may be disengaged.

According to various embodiments of the disclosure, an electronic device enables a manufacturing cost to be reduced and improves repairability.

According to various embodiments of the disclosure, an electronic device reduces a pressure applied to a connector and suppresses disengagement of a connector.

However, the problems to be solved in the disclosure are not limited to the above-mentioned problems, and may be variously expanded without departing from the spirit and scope of the disclosure.

SUMMARY

According to various embodiments of the disclosure, an electronic device includes a housing including a front plate, a rear plate, a first support member between the front plate and the rear plate, and a second support member which faces the first support member, a display including a first display surface visually exposed to an exterior of the electronic device, and a second display surface which is opposite to the first display surface, a first connector on the second display surface, a main printed circuit board in the housing, and a first flexible printed circuit board connected to the main printed circuit board, where the first flexible printed circuit board includes a second connector facing the second support member and connected to the first connector.

According to various embodiments of the disclosure, an electronic device includes a housing including a front plate, a rear plate, and a first support member between the front plate and the rear plate, a display including a first display surface on the front plate, and a second display surface which is opposite to the first display surface, where a first connector is on the second display surface, a speaker enclosure connected to the rear plate and facing the first support member, and a first flexible printed circuit board connected to the first connector and including a second connector facing the speaker enclosure.

According to various embodiments of the disclosure, an electronic device may include a plurality of flexible printed circuit boards connecting the main printed circuit board and the display to each other. By using the plurality of flexible printed circuit boards, the length of each of the flexible printed circuit boards can be reduced, and the production cost of the electronic device can be reduced.

According to various embodiments of the disclosure, the connectors may be disposed on the rear surface of the display. When the rear plate and the second support member are removed, the connectors are exposed to the exterior of the electronic device without removing the display. Thus, repairability can be improved.

According to various embodiments of the disclosure, in the electronic device, the disengagement of the connectors can be suppressed and the magnitude of pressure applied to the connectors can be reduced using components (e.g., the second support member and the speaker enclosure) facing the connectors.

According to various embodiments of the disclosure, in the electronic device, the magnitude of pressure applied to the display or the connectors can be reduced using the second support member facing the first support member.

DETAILED DESCRIPTION

Figure 1:
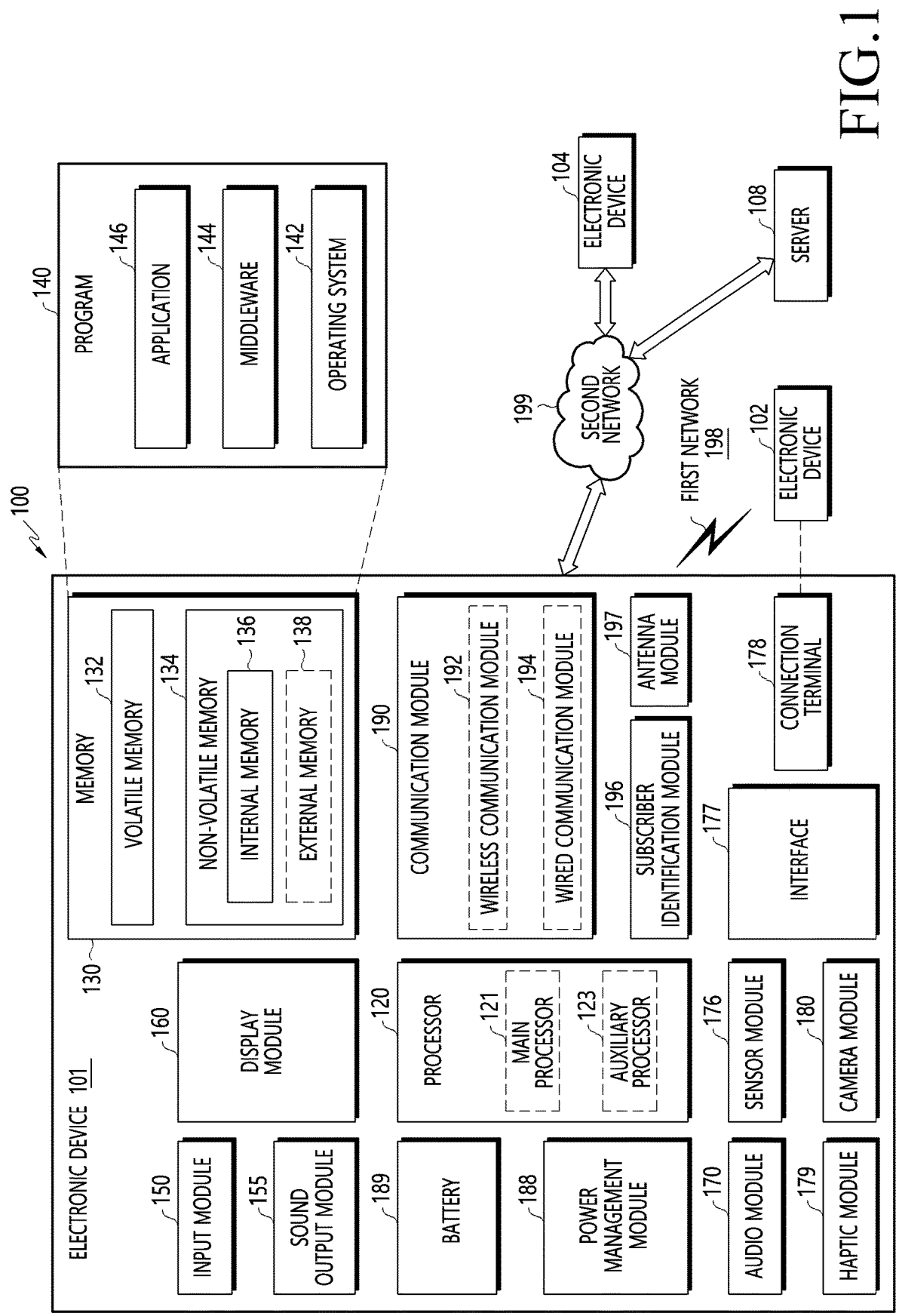
FIG. 1 is a block diagram of an electronic device according to various embodiments of the disclosure in a network environment.

FIG. 1 is a block diagram illustrating an electronic device in a network environment according to various embodiments of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", "first" and "second", or "(1-1)th", "(1-2)th", "(2-1)th" and "(2-2)th" (as "first-first," "first-second," "second-first" and "second-second" respectively) may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Figure 2:
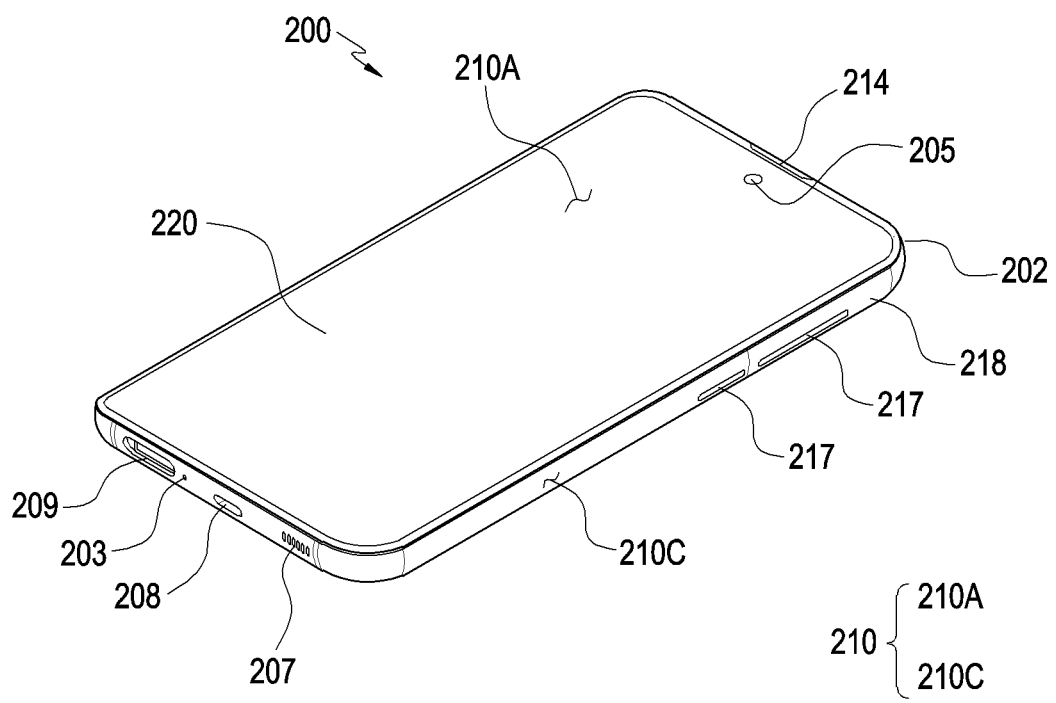
FIG. 2 is a front perspective view illustrating the electronic device according to various embodiments of the disclosure.
Figure 3:
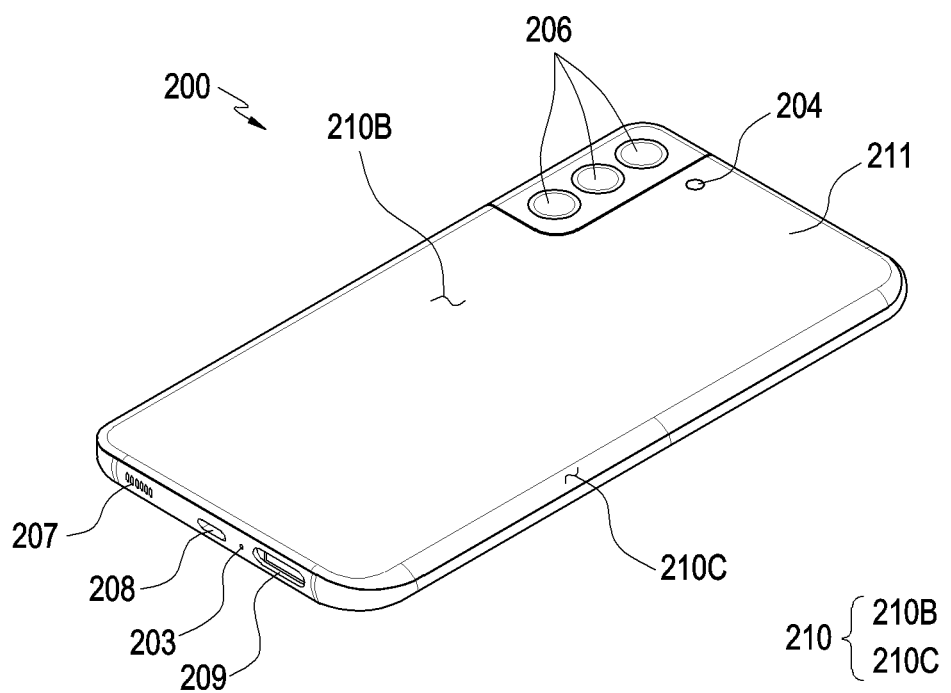
FIG. 3 is a rear perspective view illustrating the electronic device according to various embodiments of the disclosure.

FIG. 2 is a front perspective view illustrating an electronic device 200 according to various embodiments of the disclosure. FIG. 3 is a rear perspective view illustrating the electronic device 200 according to various embodiments of the disclosure.

Figure 4:
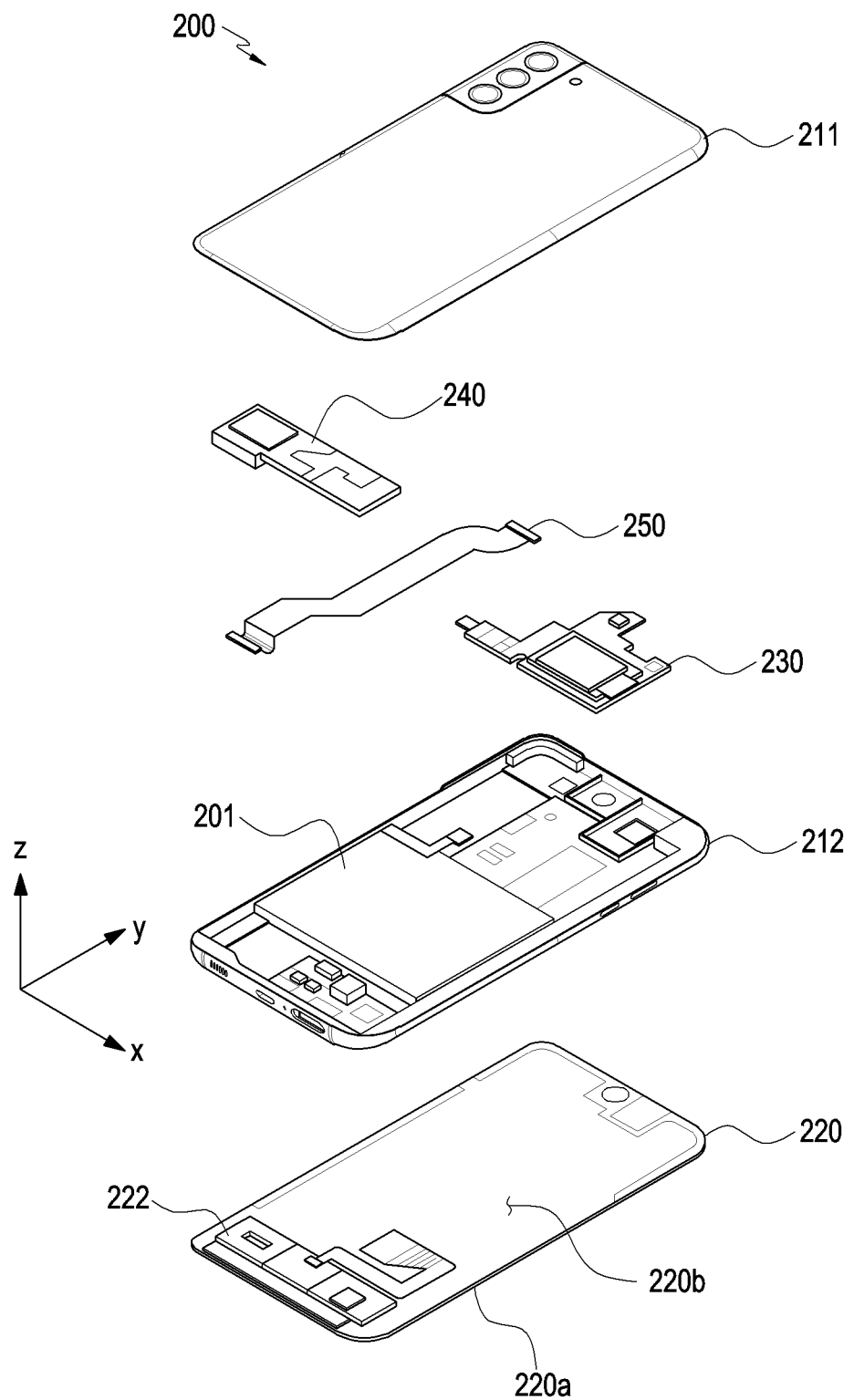
FIG. 4 is an exploded perspective view illustrating the electronic device according to various embodiments of the disclosure.

Referring to FIGS. 2 and 3, an electronic device 200 according to an embodiment may include a housing 210 including a front surface 210A, a rear surface 210B defining a space with the front surface 210A, and a side surface 210C surrounding the space between the front surface 210A and the rear surface 210B. In another embodiment (not illustrated), the term "housing 210" may refer to a structure defining a part of the front surface 210A in FIG. 2, the rear surface 210B, and the side surface 210C in FIG. 3. According to an embodiment, at least a portion of the front surface 210A may be formed of (or include) a substantially transparent front plate 202 (e.g., a glass plate or a polymer plate including various coating layers). The rear surface 210B may be defined by the rear plate 211. The rear plate 211 may be formed of, for example, glass, ceramic, a polymer, a metal (e.g., aluminum, stainless steel (STS), or magnesium), or a combination of two or more of these materials. The side surface 210C may be defined by a side bezel structure 218 (or a "side member") coupled to the front plate 202 and the rear plate 211 and including a metal and/or a polymer. In some embodiments, the rear plate 211 and the side bezel structure 218 may be integrally configured, and may include the same material (e.g., a metal material or ceramic such as glass or aluminum). According to another embodiment, the front surface 210A and/or the front plate 202 may be interpreted as a part of the display 220 (FIG. 4).

According to an embodiment, the electronic device 200 may include at least one of a display device 220 (FIG. 4), audio modules 203, 207, and 214 (e.g., the audio module 170 in FIG. 1), a sensor module (e.g., the sensor module 176 in FIG. 1), camera modules 205 and 206 (e.g., the camera module 180 in FIG. 1), a key input device 217 (e.g., the input module 150 in FIG. 1), and connector holes 208 and 209 (e.g., the connecting terminal 178 in FIG. 1). In some embodiments, in the electronic device 200, at least one of the components (e.g., the connector hole 209) may be omitted, or other components may be additionally included.

According to an embodiment, the display 220 (FIG. 1) may be visually exposed to outside of the electronic device 200 through a substantial portion of, for example, the front plate 202. In some embodiments, the edges of the display 220 may be configured to be substantially the same as the shape of the periphery of the front plate 202 adjacent thereto. In another embodiment (not illustrated), the distance between the periphery of the display 220 and the periphery of the front plate 202 may be substantially constant in order to enlarge the exposed area of the display 220.

According to an embodiment, the surface (or the front plate 202) of the housing 210 may include a screen display area provided as the display 220 is visually exposed. For example, the screen display area may include the front surface 210A.

In another embodiment (not illustrated), the electronic device 200 may include a recess or opening provided in a portion of the screen display area (e.g., the front surface 210A) of the display 220, and may include at least one of an audio module 214, a sensor module (not illustrated), a light-emitting element (not illustrated), and a camera module 205 which is aligned with the recess or opening. In another embodiment (not illustrated), the rear surface of the screen display area of the display 220 may include at least one of an audio module 214, a sensor module (not illustrated), a camera module 205, a fingerprint sensor (not illustrated), and a light-emitting element (not illustrated).

In another embodiment (not illustrated), the display 220 may be coupled to or disposed adjacent to a touch-sensitive circuit, a pressure sensor capable of measuring a touch intensity (pressure), and/or a digitizer configured to detect a magnetic-field-type stylus pen.

In some embodiments, at least a portion of the key input device 217 may be disposed on the side bezel structure 218.

According to an embodiment, the audio modules 203, 207, and 214 may include a microphone hole 203 and speaker holes 207 and 214. The microphone hole 203 may include a microphone disposed therein to acquire external sound, and in some embodiments, a plurality of microphones may be disposed therein to be able to detect the direction of sound. The speaker holes 207 and 214 may include an external speaker hole 207 and a phone call receiver hole 214. In some embodiments, the speaker holes 207 and 214 and the microphone hole 203 may be implemented as a single hole, or a speaker may be included therein without the speaker holes 207 and 214 (e.g., a piezo speaker).

According to an embodiment, the sensor modules (not illustrated) may generate an electrical signal or a data value corresponding to, for example, an internal operating state of the electronic device 200 or an external environmental state. The sensor modules (not illustrated) may include, for example, a first sensor module (not illustrated) (e.g., a proximity sensor) and/or a second sensor module (not illustrated) (e.g., a fingerprint sensor) disposed on the front surface 210A of the housing 210, and/or a third sensor module (not illustrated) (e.g., an HRM sensor) and/or a fourth sensor module (not illustrated) (e.g., a fingerprint sensor) disposed on the rear surface 210B of the housing 210. In some embodiments (not illustrated), the fingerprint sensor may be disposed not only on the front surface 210A (e.g., the display 220) of the housing 210, but also on the rear surface 210B. The electronic device 200 may further include at least one of sensor modules (not illustrated in the drawings), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor (not illustrated).

According to an embodiment, the camera modules 205 and 206 may include, for example, a front camera module 205 disposed on the front surface 210A of the electronic device 200, a rear camera module 206 disposed on the rear surface 210B, and/or a flash 204. The camera modules 205 and 206 may include one or more lenses, an image sensor, and/or an image signal processor. The flash 204 may include, for example, a light-emitting diode or a xenon lamp. In some embodiments, two or more lenses (e.g., an infrared camera, a wide-angle lens, and a telephoto lens), and image sensors may be disposed on one surface of the electronic device 200.

According to an embodiment, the key input devices 217 may be disposed on the side surface 210C of the housing 210. In another embodiment, the electronic device 200 may not include some or all of the above-mentioned key input devices 217, and a key input device 217, which is not included in the above-mentioned key input devices, may be implemented in another type, such as a soft key, on the display 220.

According to an embodiment, the light-emitting element (not illustrated) may be disposed on, for example, the front surface 210A of the housing 210. The light-emitting element (not illustrated) may provide, for example, information about the state of the electronic device 200 in an optical form. In another embodiment, the light-emitting element (not illustrated) may provide a light source that is interlocked with, for example, the operation of the front camera module 205. The light-emitting element (not illustrated) may include, for example, an LED, an IR LED, and/or a xenon lamp.

According to an embodiment, the connector holes 208 and 209 may include, for example, a first connector hole 208 capable of accommodating a connector (e.g., a USB connector) for transmitting/receiving power and/or data to/from an external electronic device, and/or a second connector hole 209 capable of accommodating a connector (e.g., an earphone jack) for transmitting/receiving an audio signal to/from an external electronic device. According to an embodiment, the first connector hole 208 or the second connector hole 209 may be omitted.

FIG. 4 is an exploded perspective view illustrating the electronic device 200 according to various embodiments of the disclosure.

Referring to FIG. 4, the electronic device 200 may include a rear plate 211, a first support member 212, a display 220, a main printed circuit board 230, a second support member 240, and a flexible printed circuit board 250 (e.g., first flexible printed circuit board). All or some of the configurations of the rear plate 211 and the display 220 of FIG. 4 may be the same as those of the rear plate 211 and the display 220 of FIG. 2 and/or FIG. 3.

According to various embodiments, the display 220 may be located on (or facing) the first support member 212. The display 220 may include a first display surface 220a, which is visually exposed to the exterior of (e.g., outside of) the electronic device 200, and a second display surface 220b which is located opposite to the first display surface 220a and at least of which is disposed on the first support member 212. According to an embodiment, the first display surface 220a may be disposed on a front plate (e.g., the front plate 202 in FIG. 2). According to an embodiment, the display 220 may include a first connector 222 to be connected to the flexible printed circuit board 250 (e.g., connectable to the flexible printed circuit board 250). The first connector 222 may be located on the second display surface 220b. According to an embodiment, the display 220 may be electrically connected to the main printed circuit board 230 via the flexible printed circuit board 250. According to an embodiment, the display 220 may be a flexible display or a foldable display.

According to various embodiments, the rear plate 211 may define at least a part of the exterior (e.g., outer surface) of the electronic device 200. For example, the rear plate 211 may define the rear surface (e.g., the rear surface 210B in FIG. 2) and/or the side surface (e.g., the side surface 210C in FIG. 2) of the electronic device 200. For example, the rear plate 211 may be integrated with the side bezel structure (e.g., the side bezel structure 218 in FIG. 2). According to another embodiment (not illustrated), the rear plate 211 may be connected to the side bezel structure 218. According to an embodiment, the rear plate 211 may be located opposite to the display 220 with reference to the first support member 212 therebetween. According to an embodiment, the rear plate 211 may include or define at least one opening for providing a path of light toward a camera module (e.g., the rear camera module 206 in FIG. 3). According to an embodiment, at least a portion of the first support member 212 may be disposed between the front plate (e.g., the front plate 202 in FIG. 2) and the rear plate 211. According to an embodiment, the first support member 212 may define a part of the side surface 210C of the electronic device 200.

According to various embodiments, the first support member 212 may support a component of the electronic device 200. For example, a component (e.g., the main printed circuit board 230 or the battery 201) of the electronic device 200 may be located on the first support member 212. According to an embodiment, among opposing surfaces, the display 220 may be disposed on one surface of the first support member 212, and the main printed circuit board 230 may be disposed on the other surface of the first support member 212. According to an embodiment, the first support member 212 may be connected to a side bezel structure (e.g., the side bezel structure 218 in FIG. 2). According to another embodiment (not illustrated), the first support member 212 may define at least a part of the outer surface of the electronic device 200. For example, the first support member 212 may be integrated with the side bezel structure 218. According to an embodiment, the first support member 212 may be made of a metal material and/or a nonmetal (e.g., a polymer) material.

According to various embodiments, the main printed circuit board 230 may be disposed on the first support member 212. According to an embodiment, the main printed circuit board 230 may accommodate a processor (e.g., the processor 120 in FIG. 1), a memory (e.g., the memory 130 in FIG. 1), and/or an interface (e.g., the interface 177 in FIG. 1).

According to various embodiments, the second support member 240 may be disposed on the first support member 212. For example, the second support member 240 may be spaced apart from the main printed circuit board 230 in a plane direction, and may be located between the rear plate 211 and the first support member 212 along a thickness direction. In an embodiment, a plane direction may be along a plane defined by a first direction (e.g., X-axis direction) and a second direction (e.g., Y-axis direction) which cross each other. A thickness direction may be defined along a third direction (e.g., Z-axis direction) crossing each of the first and second directions.

According to an embodiment, the second support member 240 may accommodate a printed circuit board on which an electronic component (e.g., the audio module 170 or the connecting terminal 178 in FIG. 1) is mounted.

According to various embodiments, the rear plate 211, the first support member 212, and/or the second support member 240 may be interpreted as a housing (e.g., the housing 210 in FIGS. 2 and 3).

Figure 5A:
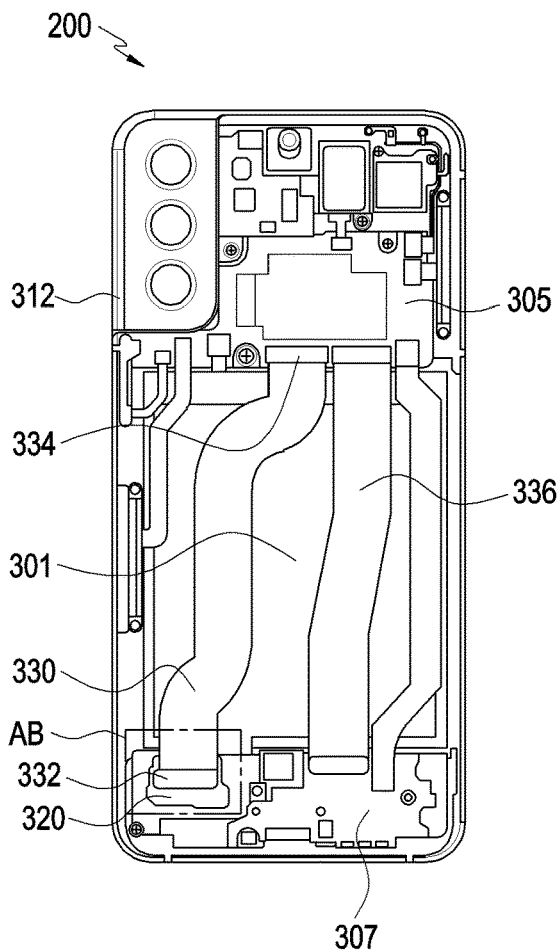
FIGS. 5A and 5B are rear views of the electronic device from which a rear plate is omitted, according to various embodiments of the disclosure.
Figure 5B:
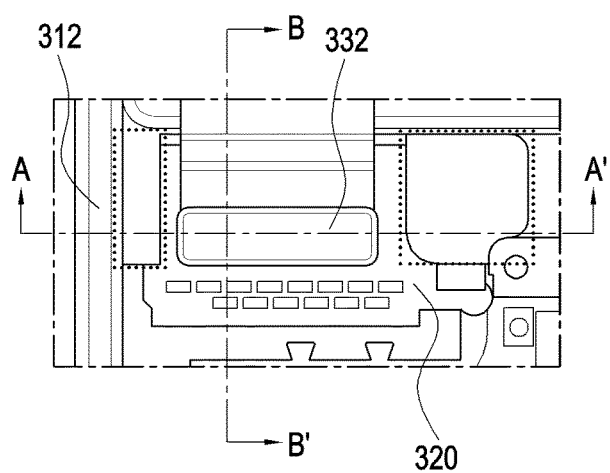
Figure 6:
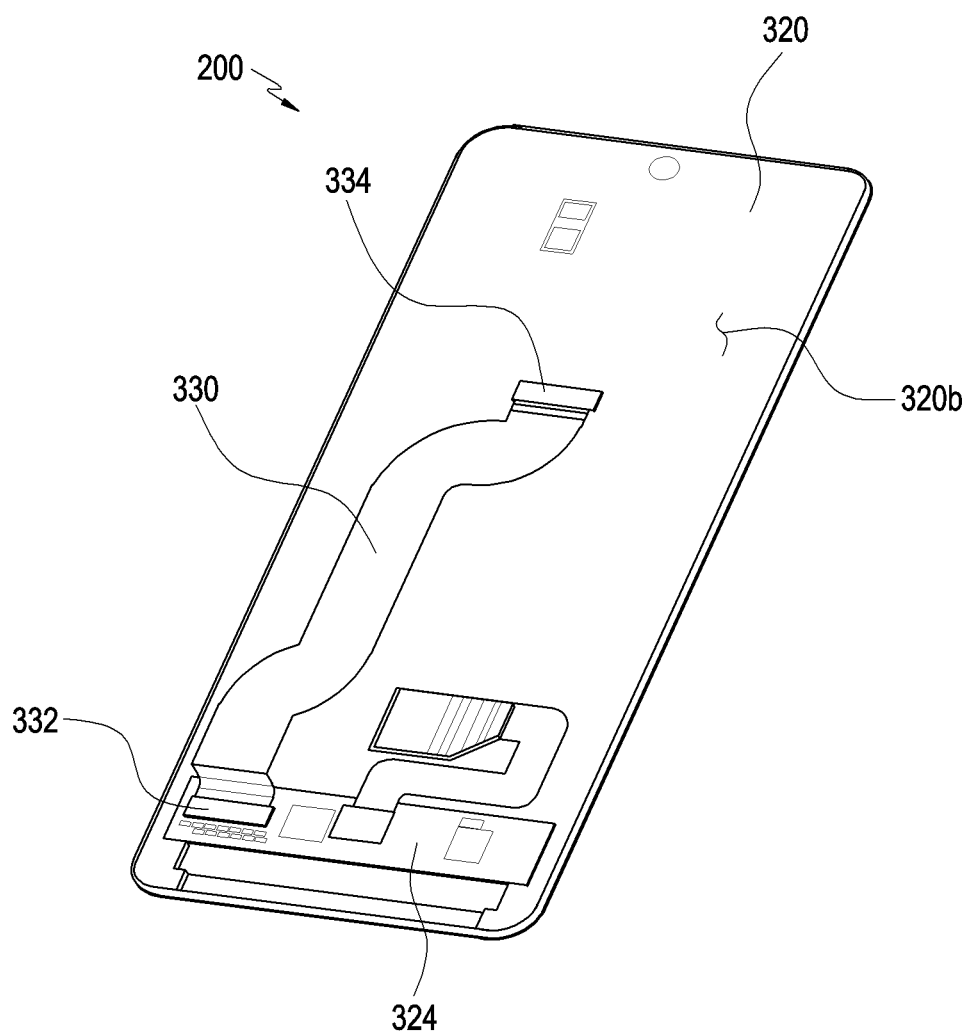
FIG. 6 is a rear perspective view of a display connected to a first flexible printed circuit board according to various embodiments of the disclosure.

FIGS. 5A and 5B are rear planar views of the electronic device 200 from which a rear plate 211 is omitted according to various embodiments of the disclosure. FIG. 6 is a rear perspective view of a display 220 connected to a flexible printed circuit board 250 according to various embodiments of the disclosure. FIG. 5B is an enlarged planar view of region AB in FIG. 5A Referring to FIGS. 5A, 5B and 6, the electronic device 200 may include a battery 301, a first support member 312, a display 320, a main printed circuit board 305, and a first flexible printed circuit board 330. All or some of the configurations of the battery 301, the first support member 312, the display 320, the main printed circuit board 305, and the first flexible printed circuit board 330 in FIGS. 5A, 5B and/or 6 may be the same as the configurations of the battery 201, the first support member 212, the display 220, the main printed circuit board 230, and the flexible printed circuit board 250 in FIG. 4.

According to various embodiments, the display 320 may be electrically connected to the main printed circuit board 305 via the first flexible printed circuit board 330. According to an embodiment, the display 320 may include a second flexible printed circuit board 324 electrically connected to a display driving circuit. The second flexible printed circuit board 324 may be connected to the second connector 332 of the first flexible printed circuit board 330 via a first connector (e.g., the first connector 222 in FIG. 4). According to an embodiment, the display 320 may include a second display surface 320b on which a first connector (e.g., the first connector 222 in FIG. 4) is mounted. For example, the second display surface 320b may be coupled to the first connector 222.

According to various embodiments, the first flexible printed circuit board 330 may include a second connector 332 configured to be connected to the first connector 222 of the display 320 and a third connector 334 configured to be connected to the main printed circuit board 305. The main printed circuit board 305 may be electrically connected to the display 320 using the first connector 222, the second connector 332, the third connector 334, and/or the first flexible printed circuit board 330. According to an embodiment, the first flexible printed circuit board 330 may extend across at least a portion of the battery 301. For example, at least a portion of the first flexible printed circuit board 330 may cover a portion of the front surface or a portion of the rear surface of the battery 301.

According to various embodiments, the electronic device 200 may include an auxiliary printed circuit board 307 mounted on the first support member 312. The auxiliary printed circuit board 307 may be connected to the main printed circuit board 305 using a third flexible printed circuit board 336.

Figure 7:
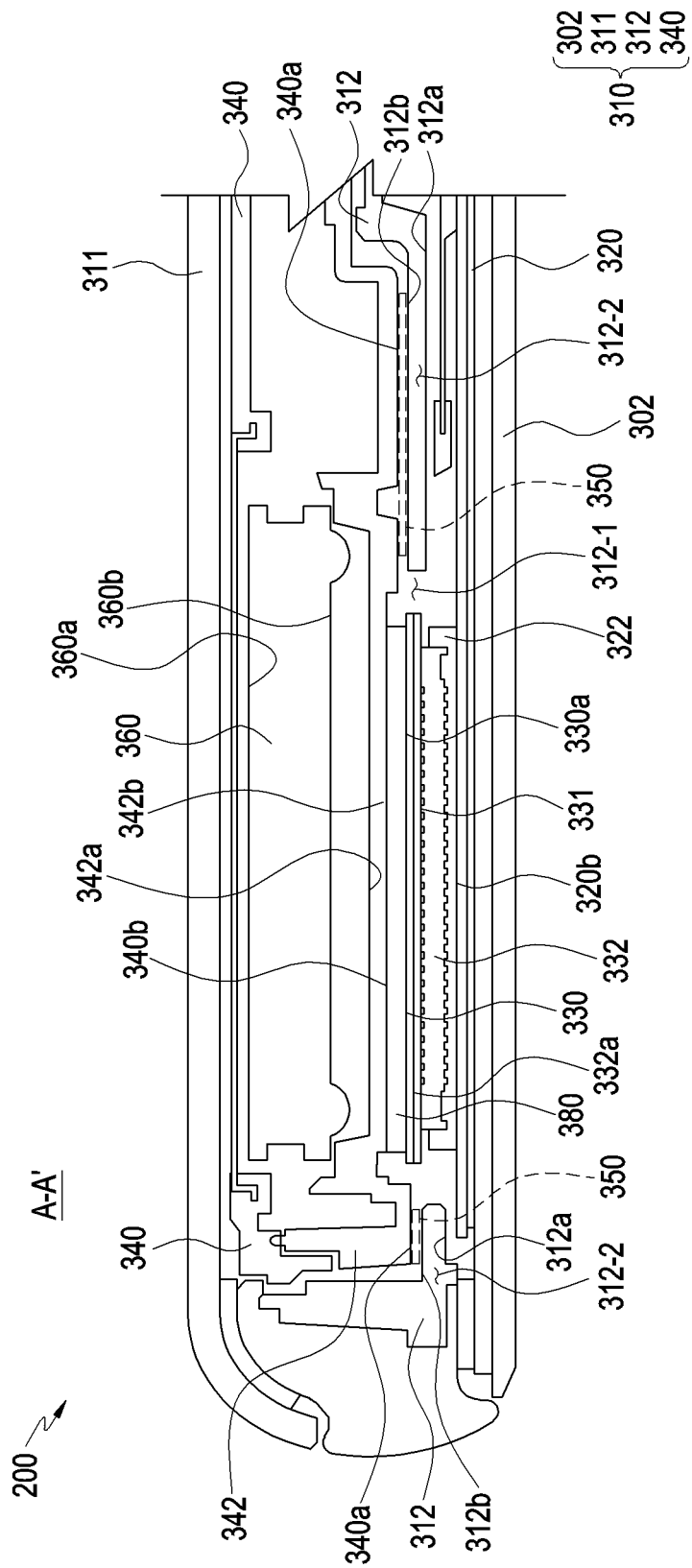
FIG. 7 is a cross-sectional view of an embodiment, taken along line A-A' in FIG. 5B.
Figure 8:
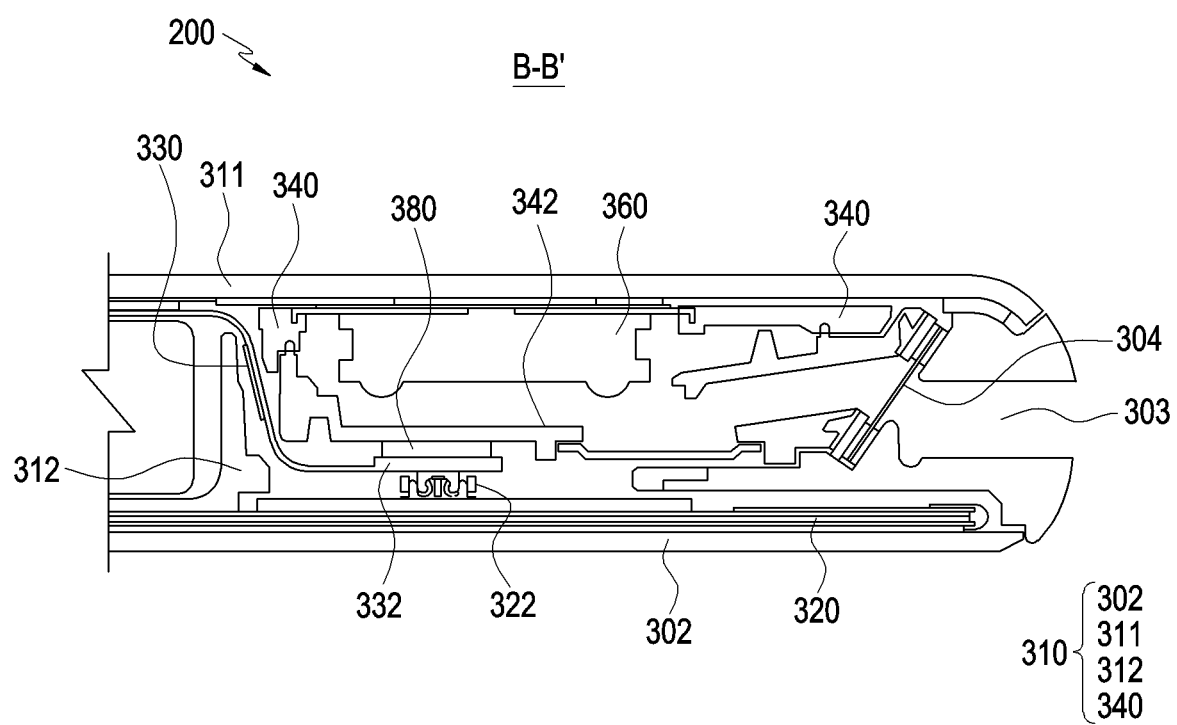
FIG. 8 is a cross-sectional view of an embodiment, taken along line B-B' in FIG. 5B.

FIG. 7 is a cross-sectional view of an embodiment, taken along line A-A' in FIG. 5B. FIG. 8 is a cross-sectional view of an embodiment, taken along line B-B' in FIG. 5B.

Referring to FIGS. 7 and 8, the electronic device 200 may include a front plate 302, a rear plate 311, a first support member 312, a display 320, a first flexible printed circuit board 330, and a second support member 340. All or some of the configurations of the front plate 302, the rear plate 311, the first support member 312, the display 320, the first flexible printed circuit board 330, and the second support member 340 in FIGS. 7 and 8 may be the same as the configurations of the front plate 202, the rear plate 211, the first support member 212, the display 220, the flexible printed circuit board 250, and the second support member 240 in FIGS. 2 to 4.

According to various embodiments, the housing 310 (e.g., the housing 210 in FIG. 2) may include a front plate 302, a rear plate 311, a first support member 312, and a second support member 340.

According to various embodiments, the display 320 may be coupled to the first connector 322 (e.g., the first connector 222 in FIG. 4). According to an embodiment, the first connector 322 may be disposed or mounted on the second display surface 320b of the display 320.

According to various embodiments, the first flexible printed circuit board 330 may include a second connector 332 (e.g., the second connector 332 in FIGS. 5A and 5B). According to an embodiment, the second connector 332 may face the second support member 340. For example, the second connector 332 may be disposed between the second support member 340 (e.g., at a speaker enclosure 342) and the first connector 322. According to an embodiment, at least a portion of the first flexible printed circuit board 330 may be disposed between the first support member 312 and the second support member 340.

According to various embodiments, the rear plate 311 and the second support member 340 may be removable from the electronic device 200, such as being removably disposed with a remainder of the electronic device 200. When the rear plate 311 and the second support member 340 are removed from the electronic device 200, the first connector 322 and the second connector 332 may be exposed to the exterior of the electronic device 200. For example, components of the electronic device 200 (e.g., the first connector 322 and/or the second connector 332) can be replaced without removing the display 320 from the electronic device 200, and repairability of the electronic device 200 can be improved.

According to various embodiments, at least a portion of the first support member 312 may face the second support member 340. For example, the first support member 312 may include a $(1-1)^{th}$ support member surface 312a facing the display 320 and a $(1-2)^{th}$ support member surface 312b located opposite to the $(1-1)^{th}$ support member surface 312a. According to an embodiment, at least a portion of the $(1-2)^{th}$ support member surface 312b may face at least a portion of the second support member 340 (e.g., the $(2-1)^{th}$ support member surface 340a).

According to various embodiments, at least a portion of the first flexible printed circuit board 330, the first connector 322, or the second connector 332 may be surrounded by the first support member 312. According to an embodiment, the first support member 312 may include (or define) a through hole 312-1 surrounding at least a portion of the first flexible printed circuit board 330. According to an embodiment, the first support member 312 may include a protrusion area 312-2 surrounding at least a portion of the through hole 312-1. The protrusion area 312-2 may be located between the display 320 and the second support member 340. For example, the protrusion area 312-2 may be interpreted as a portion of the first support member 312 facing the (2-1)$^{th}$ support member surface 340a of the second support member 340. According to an embodiment, the first support member 312 may include a speaker hole 303 (e.g., the speaker hole 207 in FIG. 2). The sound generated by the speaker unit 360 may be transmitted to the exterior of the electronic device 200 through the speaker hole 303. According to an embodiment, the electronic device 200 may include a waterproof member 304 for reducing or preventing the inflow of foreign substances or moisture from the exterior of the electronic device 200 through the speaker hole 303. The waterproof member 304 may cover at least a portion of the speaker hole 303. According to an embodiment, the waterproof member 304 may have a mesh structure.

According to various embodiments, at least a portion of the second support member 340 may face the first support member 312. According to an embodiment, the second support member 340 may be coupled to the first support member 312 using an adhesive member 350. According to an embodiment, the second support member 340 may be spaced apart from the first support member 312, along the thickness direction. For example, in the electronic device 200, the adhesive member 350 may be omitted, and the second support member 340 may include a (2-1)$^{th}$ support member surface 340a spaced apart from at least a portion of the (1-2)$^{th}$ support member surface 312b of the first support member 312.

According to various embodiments, the first support member 312 and/or the second support member 340 may reduce or prevent an impact applied to the first connector 322 and/or the second connector 332. According to an embodiment, at least some of the impact applied to the rear plate 311 and/or the front plate 302 from the exterior of the electronic device 200 may be transferred to the first support member 312 and/or the second support member 340, and the impact or pressure transferred to the first connector 322 and/or the second connector 332 may be reduced by the force distributed to the first support member 312 and/or the second support member 340.

According to various embodiments, the electronic device 200 may include an adhesive member 350 disposed between the first support member 312 and the second support member 340. According to an embodiment, the adhesive member 350 may be disposed between the (1-2)$^{th}$ support member surface 312b and the (2-1)$^{th}$ support member surface 340a. According to an embodiment, the adhesive member 350 may be an adhesive tape or an adhesive, or may define an impact-absorbing member.

According to various embodiments, the electronic device 200 may include a speaker unit 360 disposed in the housing 310. According to an embodiment, the speaker unit 360 may convert an electrical signal into sound. For example, the speaker unit 360 may include at least one of a coil (e.g., a voice coil) (not illustrated) configured to vibrate a diaphragm based on pulse width modulation (PWM), a diaphragm (not illustrated) configured to vibrate, a damping member (e.g., a spring (not illustrated)) made of a conductive material and configured to transmit a signal (e.g., electric power) transmitted from the outside of the speaker unit 360 to the coil, a magnet (not illustrated), or a conductive plate (not illustrated) configured to concentrate a magnetic field generated by the magnet. According to an embodiment, the speaker unit 360 may be connected to the second support member 340. According to an embodiment, the speaker enclosure 342 of the speaker unit 360 may be coupled to the second support member 340 using ultrasonic wave welding and/or an adhesive member (e.g., bonding, adhesive, or adhesive tape). The speaker unit 360 may be located in an internal space between the speaker enclosure 342 and the second support member 340. For example, the speaker unit 360 may be attached to the speaker enclosure 342.

According to various embodiments, the second support member 340 may include a speaker enclosure 342. According to an embodiment, the speaker enclosure 342 may be connected to the rear plate 311. For example, at least a portion of the second support member 340 may be interpreted as the speaker enclosure 342. [In addition, the speaker enclosure 342 may be interpreted as the second support member 340 (e.g., the second support member 240 in FIG. 4).]

According to an embodiment, the speaker enclosure 342 may surround at least a portion of the speaker unit 360. For example, the speaker enclosure 342 is a component configured to accommodate the components of the speaker unit 360 (e.g., the coil, the diaphragm, and the damping member), and may include at least one of a protective cover (not illustrated) configured to protect the diaphragm or a yoke configured to protect a component of the speaker unit 360 (e.g., a magnet). For example, the speaker enclosure 342 may mean a housing, a frame, or case surrounding the speaker unit 360. According to an embodiment, at least a portion of the speaker enclosure 342 may be used as a resonator configured to accumulate at least a part of the sound generated by the speaker unit 360.

According to various embodiments, the first connector 322 and the second connector 332 may be disposed under the speaker unit 360 or closer to the front plate 302. According to an embodiment, the speaker unit 360 may include a first speaker unit surface 360a facing (or closest to) the rear plate 311 and a second speaker unit surface 360b located opposite to the first speaker unit surface 360a and facing (or closest to) the speaker enclosure 342.

According to an embodiment, at least a portion of the speaker enclosure 342 may be disposed between the speaker unit 360 and the second connector 332. For example, the speaker enclosure 342 may include a first speaker enclosure surface 342a facing the second speaker unit surface 360b in the state of being spaced apart from the second speaker unit surface 360b and a second speaker enclosure surface 342b located opposite to the first speaker encloser surface 342a and facing the second connector 332.

According to various embodiments, the second support member 340 may be spaced apart from the second connector 332, along the thickness direction. According to an embodiment, the second support member 340 may include a (2-2)$^{th}$ support member surface 340b facing the second connector 332. The second connector 332 may be spaced apart from the (2-2)$^{th}$ support member surface 340b. According to an embodiment, a portion of the (2-2)$^{th}$ support member surface 340b may be interpreted as the second speaker enclosure surface 342b.

According to various embodiments, the electronic device 200 may include a protective member 380. The protective member 380 may be disposed between the second connector 332 and the second support member 340. According to an embodiment, the second connector 332 may include a first surface 332a facing the second support member 340 and/or the speaker enclosure 342, and the protective member 380 may be disposed above the first surface 332a or closer to the rear plate 311 of the second connector 332. For example, the first surface 332a may be the top surface of a connector stiffener 331 of the second connector 332. According to another embodiment, the protective member 380 may be disposed below the second support member 340. For example, the protective member 380 may be disposed below the $(2\text{-}2)^{th}$ support member surface 340b or the second speaker enclosure surface 342b. According to an embodiment, the $(2\text{-}2)^{th}$ support member surface 340b may be a surface extending from the $(2\text{-}1)^{th}$ support member surface 340a.

According to various embodiments, the protective member 380 may prevent or reduce the disengagement of the second connector 332 from the first connector 322. For example, the protective member 380 may face at least a portion of the second connector 332, and may restrict a distance by which the second connector 332 is movable, especially relative to the first connector 322. According to an embodiment, the protective member 380 may be a compressible member or an impact-absorbing member. For example, the protective member 380 may include sponge or rubber. According to an embodiment, the compressible protective member 380 may absorb at least some of the pressure applied to the electronic device 200, and may reduce the pressure applied to the display 320, the first connector 322, and the second connector 332. Damage to the display 320, the first connector 322, and/or the second connector 332 may be reduced.

Figure 9:
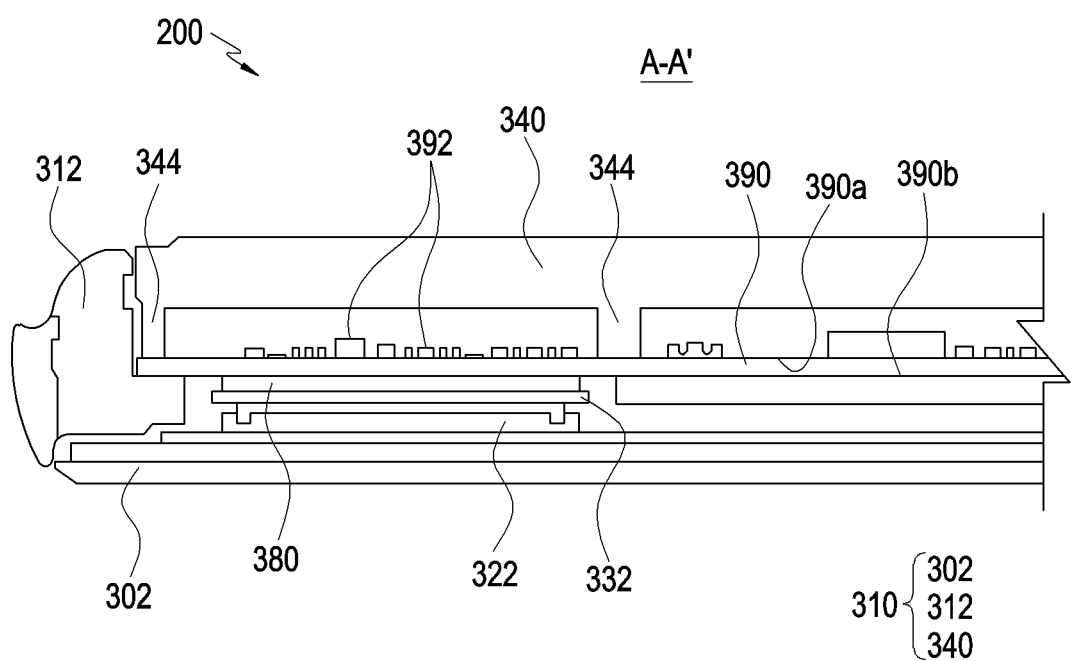
FIG. 9 is a cross-sectional view of another embodiment, taken along line A-A' in FIG. 5B.

FIG. 9 is a cross-sectional view of another embodiment, taken along line A-A' in FIG. 5B.

Referring to FIG. 9, the housing 310 of the electronic device 200 may include a front plate 302, a first support member 312, a display 320, and a second support member 340. All or some of the configurations of the front plate 302, the first support member 312, the display 320, and the second support member 340 of FIG. 9 may be the same as the front plate 302, the first support member 312, the display 320, the first flexible printed circuit board 330, and the second support member 340 of FIGS. 7 and 8.

According to various embodiments, the electronic device 200 may include a third support member 390, at least a portion of which is disposed between the first support member 312 and the second support member 340. According to an embodiment, the third support member 390 may include a $(3\text{-}1)^{th}$ support member surface 390a facing the second support member 340 and a $(3\text{-}2)^{th}$ support member surface 390b located opposite to the $(3\text{-}1)^{th}$ support member surface 390a and facing the first support member 312. According to an embodiment, the third support member 390 may be a printed circuit board. For example, at least one electronic component 392 (e.g., the processor 120 or the memory 130 in FIG. 1) may be located on the third support member 390. For example, at least one electronic component 392 may be located on the $(3\text{-}1)^{th}$ support member surface 390a and protruded therefrom toward the second support member 340, and the $(3\text{-}2)^{th}$ support member surface 390b may face the second connector 332. For example, the $(3\text{-}2)^{th}$ support member surface 390b may face the second connector 332 to which the protective member 380 is attached, and may prevent or suppress the second connector 332 from being disengaged from the first connector 322. According to an embodiment, the third support member 390 may be a bracket or a housing for defining at least a portion of the outer surface of the electronic device 200 or supporting at least some components.

Figure 10:
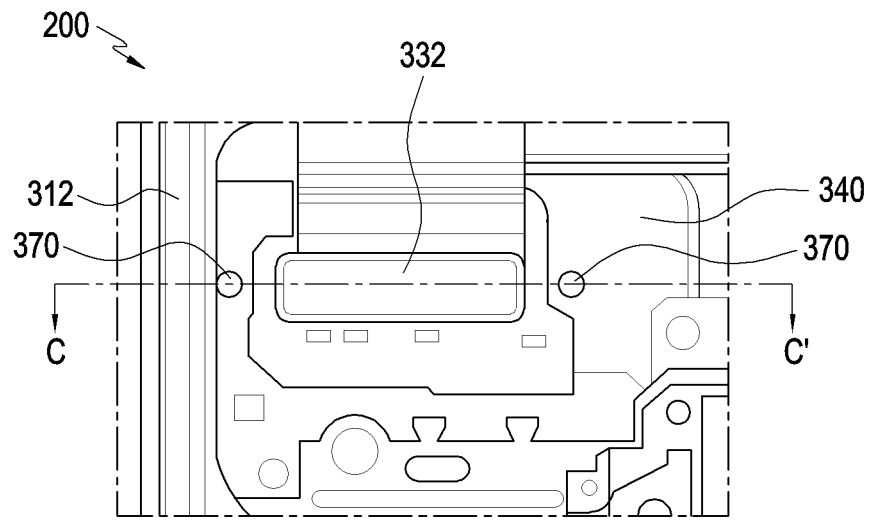
FIG. 10 is a rear view of the electronic device from which a rear plate is omitted, including a boss structure, according to various embodiments of the disclosure.
Figure 11:
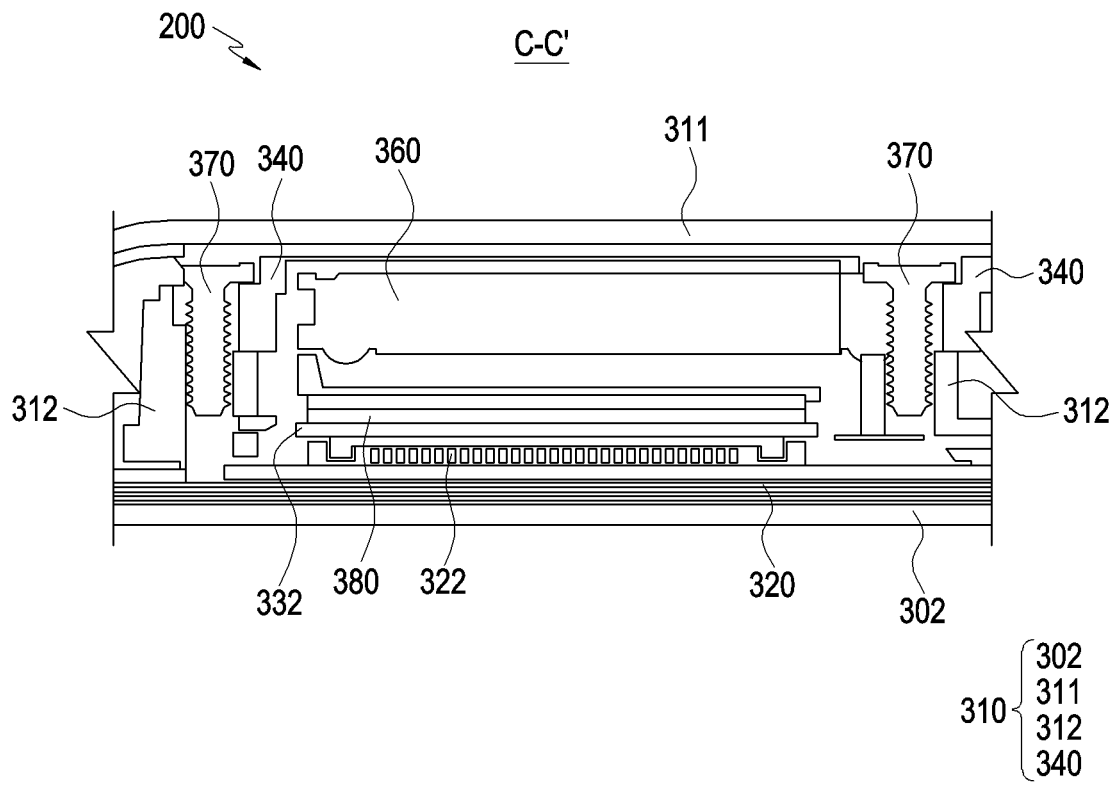
FIG. 11 is a cross-sectional view taken along line C-C' in FIG. 10.

FIG. 10 is a rear view of the electronic device from which a rear plate is omitted according to various embodiments of the disclosure. FIG. 11 is a cross-sectional view taken along line C-C' in FIG. 10.

Referring to FIGS. 10 and 11, the housing 310 of the electronic device 200 may include a front plate 302, a rear plate 311, a first support member 312, a display 320, and a second support member 340. All or some of the configurations of the front plate 302, the rear plate 311, the first support member 312, the display 320, the first flexible printed circuit board 330, and the second support member 340 in FIGS. 10 and 11 may be the same as the configurations of the front plate 302, the first support member 312, the display 320, the first flexible printed circuit board 330, and the second support member 340 in FIGS. 7 and 8.

According to various embodiments, the electronic device 200 may include at least one boss structure 370. According to an embodiment, the boss structure 370 may reduce movement of the speaker unit 360 in (or along) the thickness direction (e.g., the Z-axis direction). For example, the boss structure 370 may penetrate at least a portion of the first support member 312 and at least a portion of the second support member 340 to couple the first support member 312 and the second support member 340 to each other. According to an embodiment, the boss structure 370 may be a screw, a bolt, a rivet, or a nail. According to another embodiment (not illustrated), the electronic device 200 may include a hook structure (not illustrated) for coupling the second support member 340 to the first support member 312.

Figure 12A:
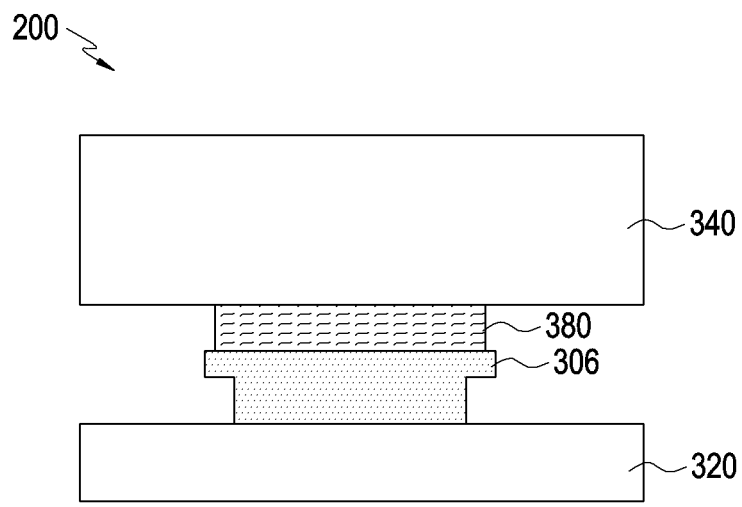
FIGS. 12A and 12B are schematic views for describing a structure for supporting a first connector and a second connector according to various embodiments of the disclosure.
Figure 12B:
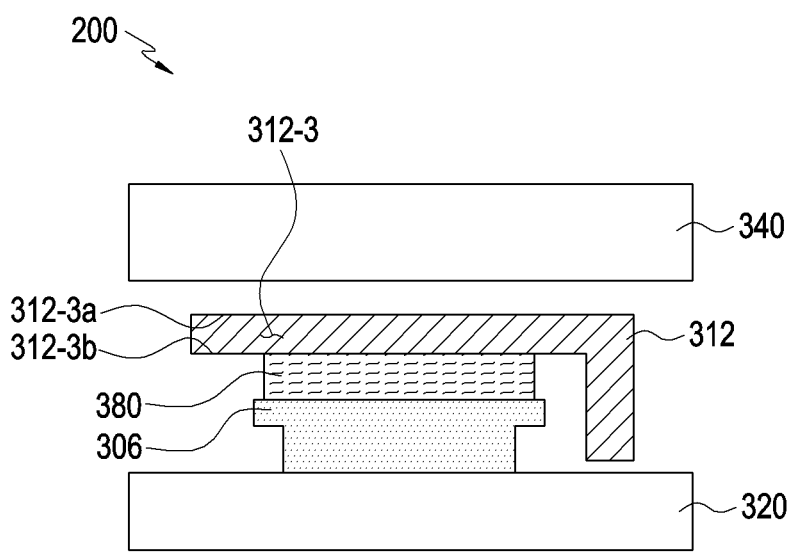

FIGS. 12A and 12B are schematic views for describing a support structure of a first connector according to various embodiments of the disclosure.

Referring to FIGS. 12A and 12B, the electronic device 200 may include a first support member 312, a display 320, a protective member 380, and/or a second support member 340. All or some of the configurations of the first support member 312, the display 320, the protective member 380, and the second support member 340 of FIGS. 12A and 12A may be the same as the first support member 312, the display 320, the protective member 380, and the second support member 340 of FIGS. 7 and 8.

According to various embodiments, the electronic device 200 may include a connector device 306. The connector device 306 may include a first connector (e.g., the first connector 322 in FIG. 7), and a second connector connected to the first connector 322 (e.g., the second connector 332 in FIG. 7). For example, the connector device 306 of FIGS. 12A and 12B may be interpreted as the first connector 322 and the second connector 332 together.

According to various embodiments (e.g., FIG. 12A), the movement of the connector device 306 in the thickness direction of the electronic device 200 (e.g., the Z-axis direction, vertical in FIG. 12A) may be restricted by the second support member 340, and the separation of the connector device 306 may be suppressed or prevented. For example, the disengagement of the second connector 332 relative to the first connector 322 may be suppressed. According to an embodiment, the connector device 306 may face the second support member 340 and may be disposed between the second support member 340 and the display 320.

According to various embodiments (e.g., FIG. 12A), the protective member 380 may be disposed between the second support member 340 and the connector device 306. The protective member 380 may prevent or suppress disengagement relative to connector device 306. For example, the protective member 380 may face at least a portion of the connector device 306 and may restrict the distance by which the connector device 306 is movable. According to an embodiment, the protective member 380 may be a compressible member. For example, the protective member 380 may include sponge or rubber. According to an embodiment, the compressible protective member 380 absorbs at least some of the pressure applied to the electronic device 200, and damage to the display 320 and/or the connector device 306 may be reduced.

According to various embodiments (e.g., FIG. 12B), the connector device 306 may face at least a portion of the first support member 312. For example, the movement of the connector device 306 in the thickness direction of the electronic device 200 (e.g., the Z-axis direction) may be restricted by the first support member 312, and the separation of the connector device 306 may be suppressed or prevented. According to an embodiment, the connector device 306 may be disposed between the first support member 312 and the display 320.

According to various embodiments (e.g., FIG. 12B), the protective member 380 may be disposed between the first support member 312 and the connector device 306. According to an embodiment, the support member 312 may include a support area 312-3 disposed between the second support member 340 and the connector device 306 (e.g., the second connector 332 in FIG. 7), and the support area 312-3 may include a first support area surface 312-3a facing the second support member 340 in the state of being spaced apart from the second support member 340, and a second support area surface 312-3b facing the protective member 380. The support area 312-3 may be an area (e.g., planar area) at which the first support member 312 and the connector device 306 overlap each other (e.g., overlapping area).

According to various embodiments of the disclosure, an electronic device (e.g., the electronic device 200 in FIG. 2) may include a housing (e.g., the housing 210 in FIG. 2) including a front plate (e.g., the front plate 202 in FIG. 2), a rear plate (e.g., the rear plate 211 in FIG. 4), a first support member (e.g., the first support member 212 in FIG. 4), at least a portion of which is disposed between the front plate and the rear plate, and a second support member (e.g., the second support member 240 in FIG. 4), at least a portion of which faces the first support member, a display (e.g., the display 220 in FIG. 4) including a first display surface (e.g., the first display surface 220a in FIG. 4) visually exposed to an exterior of the electronic device, and a second display surface (e.g., the second display surface 220b in FIG. 4) located opposite to the first display surface, where a first connector (e.g., the first connector 222 in FIG. 4) is mounted on the second display surface, a main printed circuit board (e.g., the main printed circuit board 230 in FIG. 4) disposed within the housing, and a first flexible printed circuit board (e.g., the first flexible printed circuit board 330 in FIGS. 5A and 5B) connected to the main printed circuit board, where the first flexible printed circuit board includes a second connector (e.g., the second connector 332 in FIGS. 5A and 5B) facing the second support member and connected to the first connector.

According to various embodiments, the first support member may include a $(1\text{-}1)^{th}$ support member surface (e.g., the $(1\text{-}1)^{th}$ support member surface 312a in FIG. 7) facing the display and a $(1\text{-}2)^{th}$ support member surface (e.g., the $(1\text{-}2)^{th}$ support member surface 312b in FIG. 7) located opposite to the $(1\text{-}1)^{th}$ support member surface, and the second support member may include a $(2\text{-}1)^{th}$ support member surface (e.g., $(2\text{-}1)^{th}$ support member surface 340a in FIG. 7) spaced apart from the $(1\text{-}2)^{th}$ support member surface, such as to define a first space.

According to various embodiments, the electronic device may further include an adhesive member (e.g., the adhesive member 350 in FIG. 7) disposed between the $(1\text{-}2)^{th}$ support member surface and the $(2\text{-}1)^{th}$ support member surface which are spaced apart from each other (e.g., within the first space).

According to various embodiments, the electronic device may further include a speaker unit (e.g., the speaker unit 360 in FIG. 7) coupled to the second support member.

According to various embodiments, the second support member may include a speaker enclosure (e.g., the speaker enclosure 342 in FIG. 7) surrounding at least a portion of the speaker unit, and the second connector may be disposed between the speaker enclosure and the first connector.

According to various embodiments, the speaker unit may include a first speaker unit surface (e.g., the first speaker unit surface 360a in FIG. 7) facing the rear plate and a second speaker unit surface (e.g., the second speaker unit surface 360b in FIG. 7) located opposite to the first speaker unit surface and facing the speaker enclosure, and the speaker enclosure may include a first speaker enclosure surface (e.g., the first speaker enclosure surface 342a) spaced apart from the second speaker unit surface (such as to define a second space), and a second speaker enclosure surface (e.g., the second speaker enclosure face 342b) located opposite to the first speaker enclosure surface and facing the second connector. Such a space may be considered an impact-absorbing member, since components may not come into contact with each other when an external impact is received by one of the components, owing to the distance between the components at the space.

According to various embodiments, the electronic device may further include at least one boss structure (e.g., the boss structure 370 in FIG. 11) coupled to the first support member and the second support member, such as to couple the first and second support members to each other.

According to various embodiments, the second connector may include a first surface (e.g., the first surface 330a in FIG. 7) facing the second support member, and the first flexible printed circuit board may include a protective member (e.g., the protective member 380 in FIG. 7) disposed on the first surface.

According to various embodiments, the second support member may include a $(2\text{-}2)^{th}$ support member surface (e.g., the $(2\text{-}2)^{th}$ support member surface 340b in FIG. 7) facing the second connector, and the $(2\text{-}2)^{th}$ support member surface may be spaced apart from the second connector, such as to define a third space.

According to various embodiments, the second support member may include a protective member (e.g., the protective member 380 in FIG. 7) disposed below the surface of the $(2\text{-}2)^{th}$ support member, such as being within the third space.

According to various embodiments, the display may include a second flexible printed circuit board (e.g., the second flexible printed circuit board 324 in FIG. 6) including the first connector.

According to various embodiments, the electronic device may further include a third support member (e.g., the third support member 390 in FIG. 9) disposed between the first support member and the second support member, and the third support member may include a (3-1)$^{th}$ support member surface 390a facing the second support member and (3-2)$^{th}$ support member surface 390a located opposite to the (3-1)$^{th}$ support member surface 390a and facing the second connector.

According to various embodiments, the first support member may include a through hole (e.g., the through hole 312-1 in FIG. 7) configured to accommodate at least a portion of the first flexible printed circuit board, and a protrusion area (e.g., the protrusion area 312-2 in FIG. 7) surrounding at least a portion of the through hole and located between the display and the second support member. The protrusion area may include a protrusion of the first support member which defines the through hole. The first flexible printed circuit board may extend through the through hole from a rear side of the first support member and toward the display.

According to various embodiments, the first support member may include a support area (e.g., the support area 312-3 in FIG. 12B) located between the second support member and the second connector.

According to various embodiments, the electronic device may further include a protective member (e.g., the protective member 380 in FIG. 12B) disposed between the second connector and the support area, and the support area may include a first support area surface (e.g., the first support area face 312-3a in FIG. 12B) facing the second support member in a state of being spaced apart from the second support member and a second support area surface (e.g., the second support area surface 312-3b in FIG. 12B) facing the protective member.

According to various embodiments of the disclosure, an electronic device (e.g., the electronic device 200 in FIG. 2) may include a housing (e.g., the housing 210 in FIG. 2) including a front plate (e.g., the front plate 202 in FIG. 2), a rear plate (e.g., the rear plate 211 in FIG. 4), and a first support member (e.g., the first support member 212 in FIG. 4), at least a portion of which is disposed between the front plate and the rear plate, a display (e.g., the display 220 in FIG. 4) including a first display surface (e.g., the first display surface 220a in FIG. 4) disposed on the front plate, and a second display surface (e.g., the second display surface 220b in FIG. 4) located opposite to the first display surface, where a first connector (e.g., the first connector 222 in FIG. 4) is mounted on the second display surface, a speaker enclosure (e.g., speaker enclosure 342 in FIG. 7) connected to the rear plate and facing at least a portion of the first support member, and a first flexible printed circuit board (e.g., the first flexible printed circuit board 330 in FIG. 6) including a second connector (e.g., the second connector 332 in FIG. 6) connected to the first connector and facing the speaker enclosure.

According to various embodiments, the first support member may include a (1-1)$^{th}$ support member surface (e.g., the (1-1)$^{th}$ support member surface 312a in FIG. 7) facing the display and a (1-2)$^{th}$ support member surface (e.g., the (1-2)$^{th}$ support member surface 312b in FIG. 7) located opposite to the (1-1)$^{th}$ support member surface, and the speaker enclosure may be spaced apart from the (1-2)$^{th}$ support member surface, such as to define a first space.

According to various embodiments, the electronic device may further include an adhesive member (e.g., the adhesive member 350 in FIG. 7) disposed between the (1-2)$^{th}$ support member surface and the speaker enclosure.

According to various embodiments, the electronic device may further include a speaker unit (e.g., the speaker unit 360 in FIG. 7) accommodated in the speaker enclosure, where the speaker unit may include a first speaker unit surface (e.g., the first speaker unit surface 360a in FIG. 7) facing the rear plate and a second speaker unit surface (e.g., the second speaker unit surface 360b in FIG. 7) located opposite to the first speaker unit surface and facing the speaker enclosure, and the speaker enclosure may include a first speaker enclosure surface (e.g., the first speaker enclosure surface 342a) spaced apart from the second speaker unit surface (such as to define a second space), and a second speaker enclosure surface (e.g., the second speaker enclosure face 342b) located opposite to the first speaker enclosure surface and facing the second connector.

According to various embodiments, the second connector may include a first surface (e.g., the first surface 330a in FIG. 7) facing the speaker enclosure (such as to define a third space), and the electronic device may further include a protective member (e.g., the protective member 380 in FIG. 7) disposed on the first surface and within the third space.

It may be apparent to a person ordinarily skilled in the technical field to which the disclosure belongs that the above-described electronic device including a connector according to the disclosure is not limited by the above-described embodiments and drawings, and can be variously substituted, modified, and changed within the technical scope of the disclosure.

What is claimed is:

1. An electronic device comprising:
   a housing including a front plate, a rear plate, a first support member, at least a portion of which is disposed between the front plate and the rear plate, and a second support member facing the first support member;
   a display including a first display surface visually exposed to an exterior of the electronic device, and a second display surface which is opposite to the first display surface;
   a first connector mounted on the second display surface and connected to the display;
   a main printed circuit board disposed between the first support member and the rear plate; and
   a first flexible printed circuit board which connects the main printed circuit board to the first connector and includes a second connector connected to the first connector,
   wherein the second connector of the first flexible printed circuit board faces the second support member of the housing.

2. The electronic device of claim 1, wherein
   the first support member includes a (first-first)$^{th}$ support member surface facing the display, and a (first-second)$^{th}$ support member surface which is opposite to the (first-first)$^{th}$ support member surface, and
   the second support member includes a (second-first)$^{th}$ support member surface facing and spaced apart from the (first-second)$^{th}$ support member surface of the first support member.

3. The electronic device of claim 2, further comprising:
   an adhesive member disposed between the (first-second)$^{th}$ support member surface of the first support member, and the (second-first)$^{th}$ support member surface of the second support member, which are spaced apart from each other.

4. The electronic device of claim 1, further comprising:
   a speaker unit coupled to the second support member.

5. The electronic device of claim 4, wherein
the second support member includes a speaker enclosure,
the speaker unit is in the speaker enclosure, and
the second connector is disposed between the speaker enclosure and the first connector.

6. The electronic device of claim 5, wherein
the speaker unit includes a speaker unit surface facing the speaker enclosure, and
the speaker enclosure includes a first speaker enclosure surface facing and spaced apart from the speaker unit surface, and a second speaker enclosure surface which is opposite to the first speaker enclosure surface and facing the second connector.

7. The electronic device of claim 5, further comprising:
a boss structure which couples the first support member and the second support member to each other.

8. The electronic device of claim 1, wherein the second connector of the first flexible printed circuit board includes a surface which faces the second support member,
further comprising:
an impact-absorbing member between the surface of the second connector and the second support member.

9. The electronic device of claim 1, wherein
the second support member includes a (second-second)$^{th}$ support member surface facing the second connector, and
the (second-second)$^{th}$ support member surface of the second support member is spaced apart from the second connector.

10. The electronic device of claim 9, further comprising:
an impact-absorbing member between the second connector and the (second-second)$^{th}$ support member surface of the second support member which are spaced apart from each other.

11. The electronic device of claim 1, wherein the display includes a second flexible printed circuit board including the first connector.

12. The electronic device of claim 1, further comprising:
a third support member disposed between the first support member and the second support member,
wherein
the third support member includes a (third-first)$^{th}$ support member surface facing and spaced apart from the second support member, and a (third-second)$^{th}$ support member surface which is opposite to the (third-first)$^{th}$ support member surface, facing the second connector and spaced apart from the second connector.

13. The electronic device of claim 1, wherein
the first support member defines a through hole corresponding to the first connector, and
the first flexible printed circuit board extends through the through hole of the first support member.

14. The electronic device of claim 1, wherein
the second connector of the first flexible printed circuit board faces the second support member of the housing with the first support member of the housing therebetween, and
the first support member includes a support area between the second support member and the second connector.

15. The electronic device of claim 14, wherein the support area of the first support member includes a first support area surface facing and spaced apart from the second support member, and a second support area surface facing and spaced apart from the second connector,
further comprising:
an impact-absorbing member disposed between the second connector and the second support area surface of the support area.

16. The electronic device of claim 1, further comprising an electronic component in the second support member,
wherein the second connector of the first flexible printed circuit board faces the electronic component which is received in the second support member of the housing.

17. The electronic device of claim 1, wherein
the first support member defines a through hole surrounding a portion of the second connector of the first flexible printed circuit board, and
the second support member is coupled to the first support member.

18. An electronic device comprising:
a housing including a front plate, a rear plate, and a first support member, at least a portion of which is disposed between the front plate and the rear plate;
a display including a first display surface disposed on the front plate, and a second display surface which is opposite to the first display surface;
a first connector mounted on the second display surface and connected to the display;
a speaker enclosure connected to the rear plate of the housing and facing the first support member of the housing; and
a first flexible printed circuit board including a second connector which is connected to the first connector,
wherein the second connector of the first flexible printed circuit board faces the speaker enclosure.

19. The electronic device of claim 18, wherein
the first support member includes a (first-first)$^{th}$ support member surface facing the display, and a (first-second)$^{th}$ support member surface which is opposite to the (first-first)$^{th}$ support member surface, and
the speaker enclosure is spaced apart from the (first-second)$^{th}$ support member surface of the first support member.

20. The electronic device of claim 19, further comprising:
an adhesive member disposed between the (first-second)$^{th}$ support member surface of the first support member, and the speaker enclosure.

* * * * *